United States Patent
Garrido-Gadea et al.

(10) Patent No.: US 7,988,054 B2
(45) Date of Patent: Aug. 2, 2011

(54) SECURE CARD READER

(75) Inventors: Enrique Garrido-Gadea, Hazlemere (GB); Andrew Graham Hodges, Aylesbury (GB); Richard Andrew Hodson, Reading (GB); Richard Ward, Watlington (GB); Gareth Alexander Richards, Bristol (GB)

(73) Assignee: Verifone Israel Ltd. (IL)

( * ) Notice: Subject to any disclaimer, the term of this patent is extended or adjusted under 35 U.S.C. 154(b) by 868 days.

(21) Appl. No.: 10/591,267

(22) PCT Filed: Feb. 18, 2005

(86) PCT No.: PCT/EP2005/050727
§ 371 (c)(1),
(2), (4) Date: Oct. 11, 2007

(87) PCT Pub. No.: WO2005/086546
PCT Pub. Date: Sep. 15, 2005

(65) Prior Publication Data
US 2008/0164320 A1    Jul. 10, 2008

(30) Foreign Application Priority Data

Mar. 4, 2004  (GB) .................................. 0404922.7
Feb. 4, 2005  (GB) .................................. 0502343.7

(51) Int. Cl.
*G06K 5/00* (2006.01)
*G06K 19/06* (2006.01)
(52) U.S. Cl. .................................. 235/472.01; 235/492
(58) Field of Classification Search ............. 235/472.01, 235/472.02, 472.03, 492, 441, 486, 487
See application file for complete search history.

(56) References Cited

U.S. PATENT DOCUMENTS

| | | | |
|---|---|---|---|
| 3,760,137 A | 9/1973 | Shimojo et al. | |
| 4,521,679 A | 6/1985 | Anderson | |
| 4,524,249 A | 6/1985 | Farrell | |
| 4,703,160 A | 10/1987 | Narishima et al. | |
| 5,027,397 A * | 6/1991 | Double et al. | 713/194 |
| 5,159,629 A * | 10/1992 | Double et al. | 713/194 |

(Continued)

FOREIGN PATENT DOCUMENTS

DE      30 23 427 A1    1/1981

(Continued)

OTHER PUBLICATIONS

Patent Abstracts of Japan, vol. 2000, No. 22, Mar. 9, 2001 JP 2001 135384A (Yamaichi Electronics Co. Ltd., Matsushita Electric Ind Co Ltd May 18, 2001.

(Continued)

*Primary Examiner* — Thien M Le
(74) *Attorney, Agent, or Firm* — Lando & Anastasi, LLP

(57) ABSTRACT

A secure card reader includes several security measures. Access to the reader's main circuitry is prevented by an enclosed whose walls contain embedded conductive paths. Breaking or grounding of one of these paths can be detected electronically. A similar arrangement of conductive paths prevent enlarging of a card received slot (9c). If tampering is detected using the embedded conductive paths, the reader's memory is wiped. The enclosure has apertures in its walls and is held in place by a potting material that extends into the apertures. A method is also provided to detect attempts to probe behind a keypad membrane. The contacts for the chip of a chip card are arranged so that their leads all extend away from the card insertion slot.

19 Claims, 10 Drawing Sheets

U.S. PATENT DOCUMENTS

| | | | |
|---|---|---|---|
| 5,858,500 | A | 1/1999 | MacPherson |
| 5,909,025 | A * | 6/1999 | Schmitt et al. ............... 235/492 |
| 5,915,016 | A * | 6/1999 | Savalle et al. ........... 379/433.09 |
| 5,969,331 | A | 10/1999 | Hoolhorst et al. |
| 6,134,114 | A | 10/2000 | Ungermann et al. |
| 6,185,507 | B1 | 2/2001 | Huber et al. |
| 6,222,525 | B1 | 4/2001 | Armstrong |
| 6,234,845 | B1 | 5/2001 | Hakozaki |
| 6,293,464 | B1 | 9/2001 | Smalley, Jr. |
| 6,354,714 | B1 | 3/2002 | Rhodes |
| 6,508,673 | B2 * | 1/2003 | McDowell .................... 439/630 |
| 6,686,539 | B2 | 2/2004 | Farquhar et al. |
| 6,970,360 | B2 | 11/2005 | Sinha |
| 7,144,271 | B1 * | 12/2006 | Burris et al. ................. 439/578 |
| 7,234,970 | B2 * | 6/2007 | Valcher et al. ............... 439/630 |
| 2001/0039146 | A1 | 11/2001 | McDowell |
| 2002/0168900 | A1 | 11/2002 | Chen |
| 2004/0120101 | A1 * | 6/2004 | Cohen et al. ................. 361/654 |
| 2005/0198424 | A1 * | 9/2005 | Harari et al. ................. 710/301 |
| 2007/0181699 | A1 * | 8/2007 | Yi et al. ....................... 235/492 |

FOREIGN PATENT DOCUMENTS

| | | |
|---|---|---|
| DE | 91 05 960 U1 | 6/1992 |
| EP | 0 031576 A1 | 12/1980 |
| EP | 0180073 A2 | 5/1986 |
| EP | 0 653 768 A1 | 9/1994 |
| EP | 1152492 A | 11/2001 |
| EP | 1 260 931 A1 | 11/2002 |
| GB | 865874 | 4/1961 |
| GB | 935103 | 8/1963 |
| GB | 963752 | 7/1964 |
| GB | 1 441 765 | 7/1976 |
| JP | 09198958 A | 7/1997 |
| WO | WO 0143235 A | 6/2001 |
| WO | WO 03/003294 A1 | 1/2003 |

OTHER PUBLICATIONS

Patent Abstracts of Japan, vol. 2000 No. 23, Feb. 10, 2001 JP 2001 167232 A (Yamaichi Electronics Co Ltd; Matsushita Electric Ind Co ltd, Jun. 22, 2001).

* cited by examiner (a)

(b)

(c)

(d)

SECURE CARD READER

FIELD OF THE INVENTION

The present invention relates to a secure card reader and, more particularly, to various security features that may be employed individually or in combinations.

BACKGROUND

Card readers for reading credit cards or the like are a familiar feature of modern life. In order for commerce to proceed using such devices, the devices must be secure so that they cannot be manipulated to facilitate fraudulent transactions.

US-A-2004/0120101 discloses a card reader in which circuitry is enclosed in a tamper-detecting enclosure. However, the chip card contact module is mounted outside of the tamper-detecting enclosure.

SUMMARY

According to a first aspect of the present invention, there is provided an apparatus comprising a wall with an aperture in it, wherein at least on taper detection conductor path is embedded in said wall around the aperture for detection of widening of the aperture. Thus, an article, for example a chip card, can be inserted into a secure device without the risk of an attack involving enlarging the aperture to allow the article to be inserted with wires or other data extraction devices attached thereto.

Preferably, the wall is a wall of an anti-tamper enclosure having at least one tamper detection conductive path embedded therein, an electronic circuit is located within the enclosure and object receiving means, within the enclosure and aligned with the aperture, the aperture being configured to allow insertion of an object for which the object receiving means is configured. More preferably, the object receiving means serves as an anti-probing barrier behind the aperture preventing access to said electronic circuit. The aperture may be configured for endways insertion of a credit card, in which case the object receiving means is a chip card contact module.

The conductive path or paths preferably extend across the whole of the enclosure such that cutting through the enclosure, to make electrical contact with the circuit, without breaking or grounding an embedded conductive path is substantially impracticable.

The conductive path or paths are arranged in a plurality of layers such that conductors in different layers are offset relative to each other. In other words, gaps between conductors in one layer are blocked by conductors in one or more other layers.

The enclosure may be assembled from a plurality of printed circuit boards, which can optionally be electrically connected and/or connected by an interlocking mechanical joint.

The electronic circuit may comprise means for feeding current through each conductive path and detecting disturbances thereof.

The electronic circuit may comprise a multi-layer printed circuit board having a first face on which components are mounted, a second face on which no components are mounted. The conductors carrying signals between said components are preferably separated from the second face by a tamper detection conductive path.

According to a second aspect of the present invention, there is provided an apparatus comprising a housing member and an enclosure fixed in the housing member by a potting material, wherein the enclosure includes holes, which may be through holes into which the potting material extends.

Preferably, the enclosure has an opening on one side and the opening is covered by a housing member. More preferably, the holes are provided around the rim of the opening, which may be received in a channel included in the housing member.

According to a third aspect of the present invention, there is provided an apparatus comprising:
 a first housing shell having holes;
 a second housing shell press-fitted to the first shell; and
 a keypad membrane located in the first shell such that its keys extend through said holes,
 wherein a wall is provided in the first or second shell to form a barrier between the seam between the shells and the membrane.

According to a fourth aspect of the present invention, there is provided a chip card contact module comprising a plurality of conductors leading from respective contacts, wherein none of the conductors leads from a contact in a direction opposite to any other.

The contact module preferably has a card input side into which a card can be inserted for reading, wherein none of said conductors leads from a contact towards the card input side. The contacts may be arranged in two rows comprising a front row and a back row, the front row being nearer the card input side than is the back row. Preferably, the conductors from the back row lead directly away from the card input side and the conductors from the front row diverge and then lead directly away from the card input slot.

According to a fourth aspect of the present invention, there is provided a keypad comprising a flexible membrane overlying a circuit board, the flexible membrane having a first set of conductive elements for connecting tracks on the circuit board so as to form push to make switches and a second set of conductive elements connecting tracks on the circuit board.

Preferably, the conductive elements of the first set are located in respective recesses aligned with respective buttons. More preferably, the conductive elements of the second set of located outside of said recesses.

The keypad is preferably installed behind an element which has apertures through which the buttons project and projections that bare against the membrane at positions aligned with the conductive elements of said second set.

The keypad may be included in an apparatus having means for passing current through the second set of conductive elements and means for detecting an interruption of current through the second set of conductive elements to produce a tamper condition indicating signal.

The foregoing aspects of the present invention may be employed in a card reader either individually or in combination. Preferably, all aspects are used together.

BRIEF DESCRIPTION OF THE DRAWINGS

An embodiment of the present invention will now be described, by way of example, with reference to the accompanying drawings, in which.

DETAILED DESCRIPTION

Figure 1:
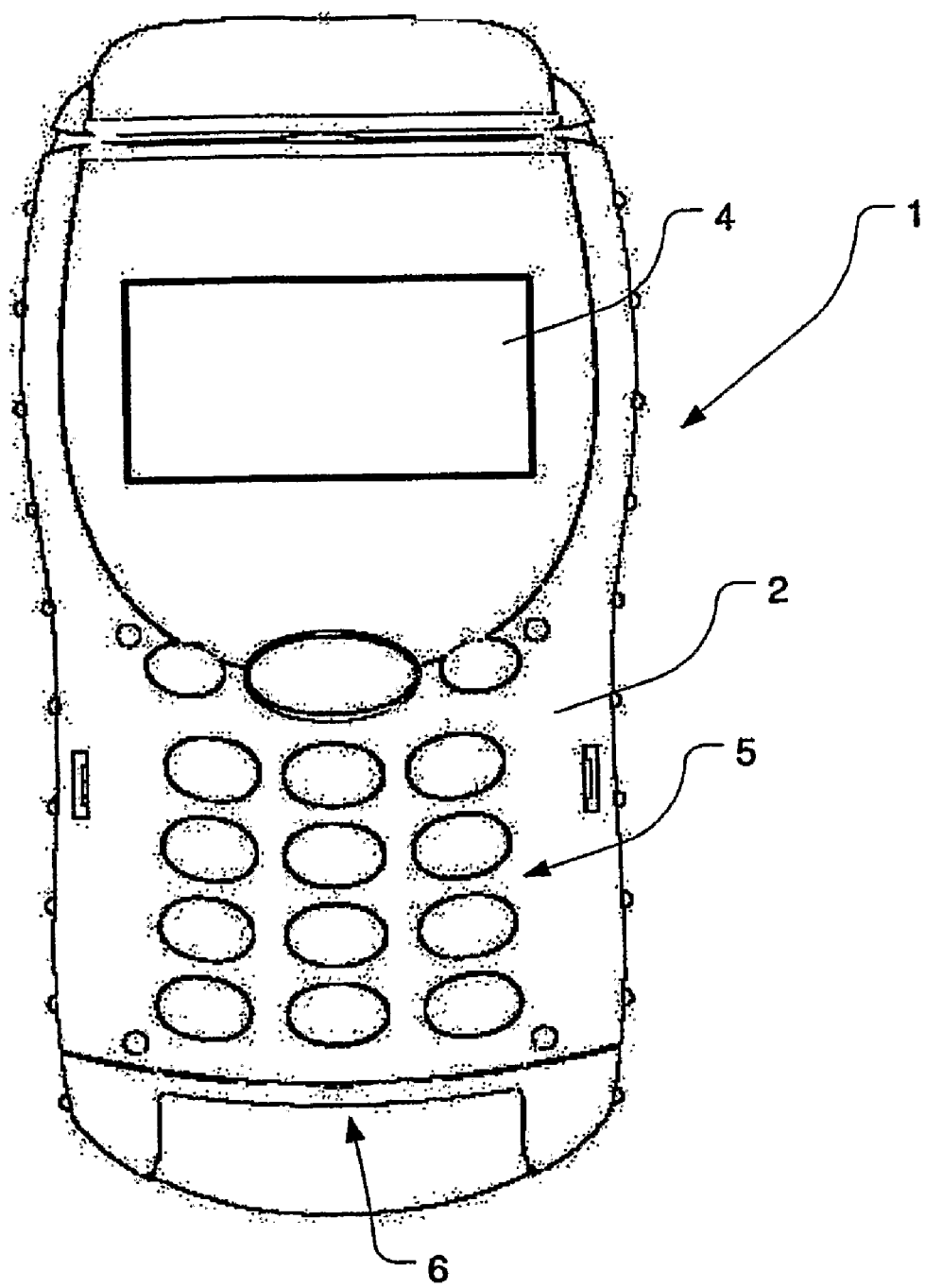
FIG. 1 is a front view of a card reader module according to one embodiment of the present invention.

Referring to FIG. 1, a card reader 1 comprises a body 2. A window 4, revealing an LCD panel, is located in to top half of the body 2 and the keys 5 of a keypad are distributed below the window 4. A card insertion slot 6 opens at the foot of the reader and chip cards can be inserted lengthways upwards into the slot 6 for reading.

Figure 2:
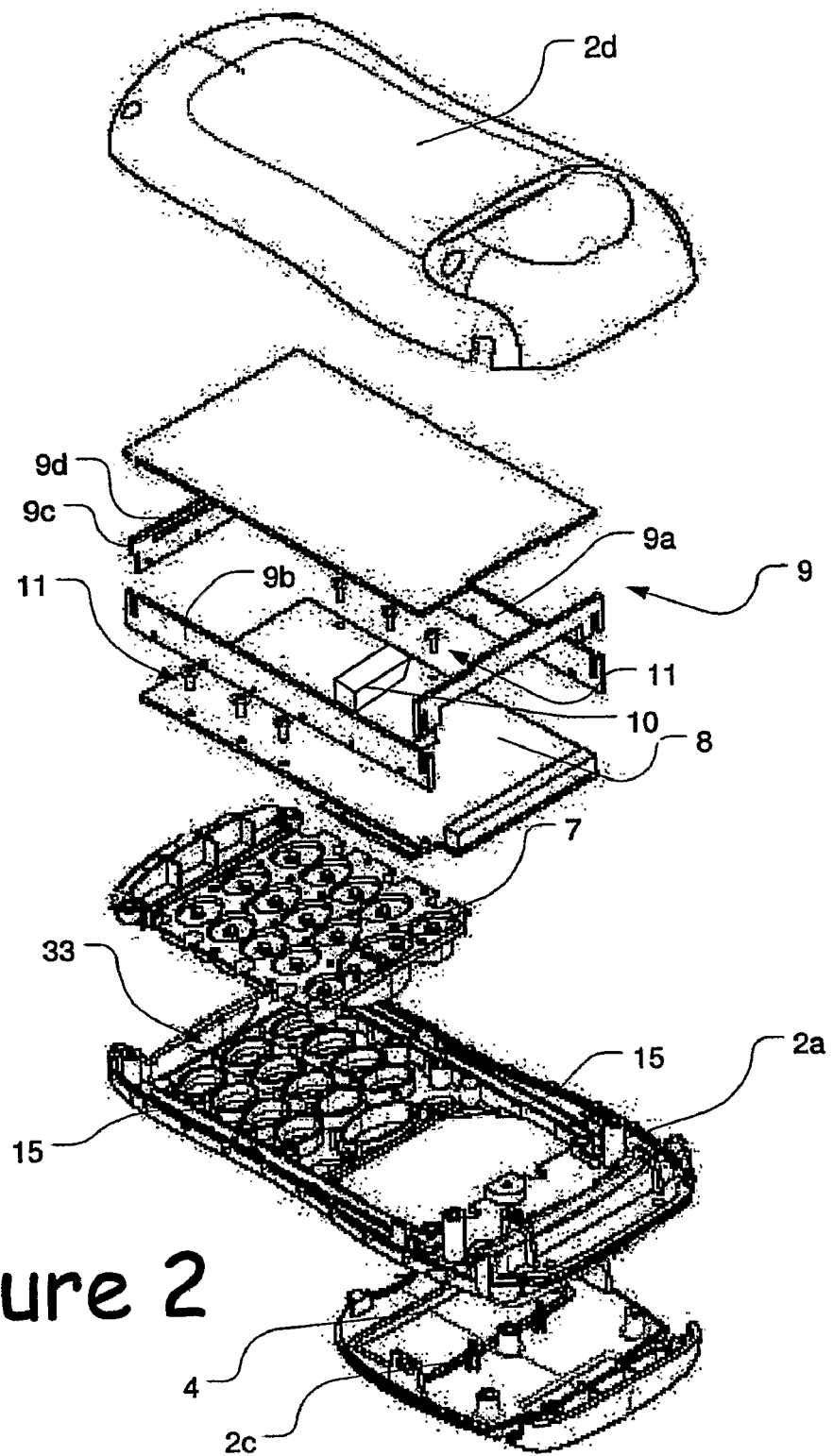
FIG. 2 is an exploded view of the card reader shown in FIG. 1.
Figure 3:
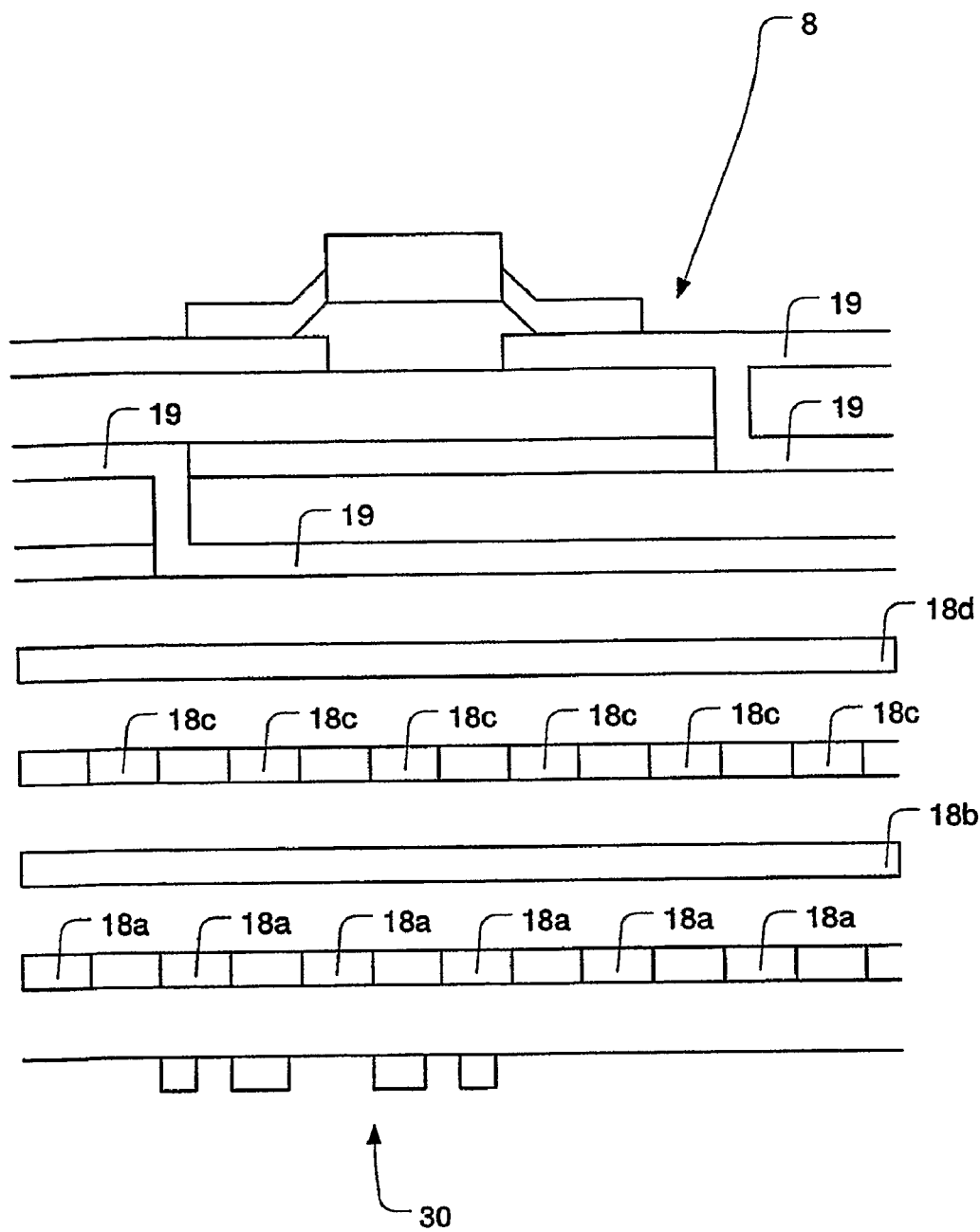
FIG. 3 is cross-section, somewhat exaggerated for clarity, of part of the PCB shown in FIG. 2.
Figure 4:
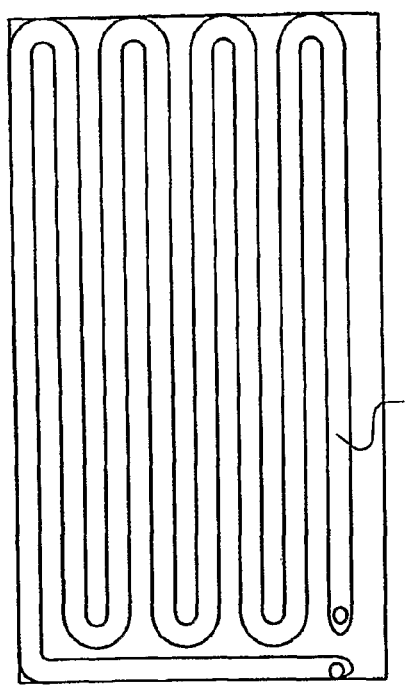
FIGS. 4(a) to 4(b) show, somewhat exaggerated for clarity, the tamper detection layers of the PCB shown in FIG. 3.
Figure 4:
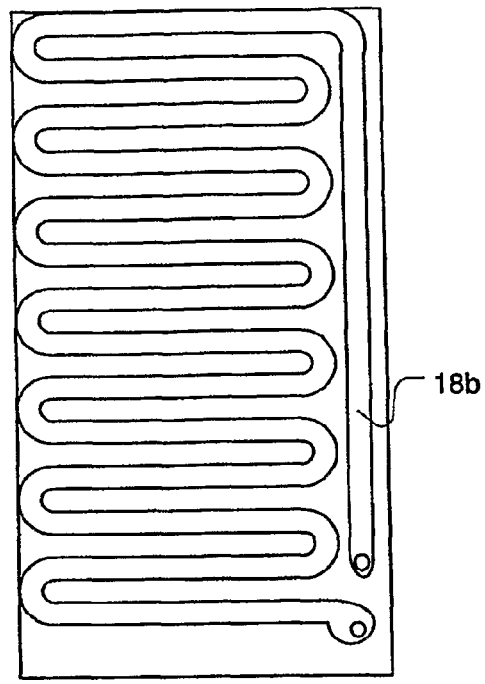
Figure 4:
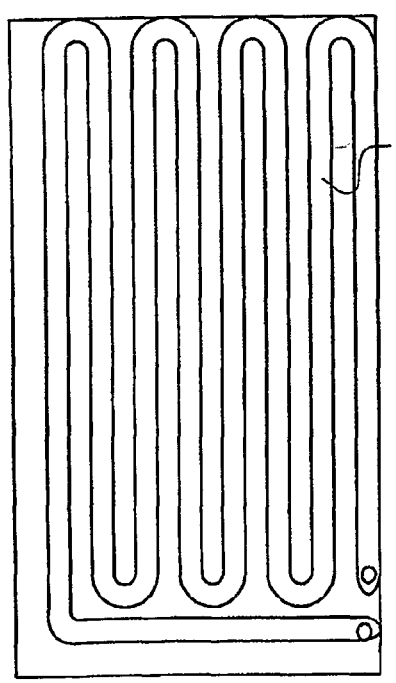
Figure 4:
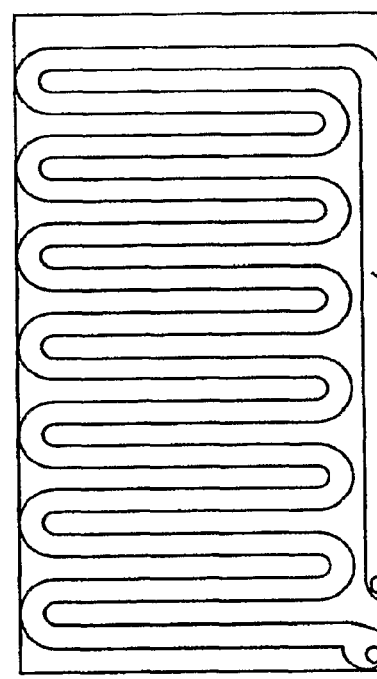

Referring to FIG. 2, the body 2 comprises a front and back main members 2a, 2b. The front and back main members 2a, 2d are coupled together by screws (not shown). The window 4 is incorporated into a bezel member 2c which is screwed to the front of the front main member 2a through PCB 8, thereby preventing removal of the window 4 when the module has been assembled.

The back main member 2d may be dispensed with and the front main member 2a fixed to another apparatus, which itself prevents access to the internals of the card reader 1 from behind.

A keypad membrane 7, a PCB 8, a cover 9 (shown exploded) are sandwiched with the keypad membrane 7 at the front and the cover 9 at the back. The keypad membrane 7 includes keys 5 which project through corresponding holes 33 in the front main member 2a. The PCB 8 is attached to the front main member 2a by screws 11 so that the keypad member 7 is located between the PCB 8 and the front main member 2a. The cover 9 is assembled from multi-layer PCBs and its sidewalls 9a, 9b are received in channels 15 formed by walls projecting from the back of the front main member 2a. The cover 9 completely covers the PCB 8 such that the only access to the PCB 8 is through a card entry slot 9c in a first end wall 9d. Referring to FIGS. 3 and 4(a) to 4(d), the PCB 8 is a multi-layer PCB. The keypad side of the PCB 8 contains tracks 30 forming the fixed contacts of the keys. Above the key contact tracks 30 are four layers containing serpentine tracks 18a, 18b, 18c, 18d. These serpentine conductive tracks 18a, 18b, 18c, 18d are offset with respect to each other and arranged so that active signal paths 19 in other layers cannot be reached without breaking one of the serpentine tracks 18a, 18b, 18c, 18d and interrupting a monitoring current flowing therethrough. The loops of the serpentine tracks 18a, 18b, 18c, 18d are packed as close as is practicable.

Figure 5:
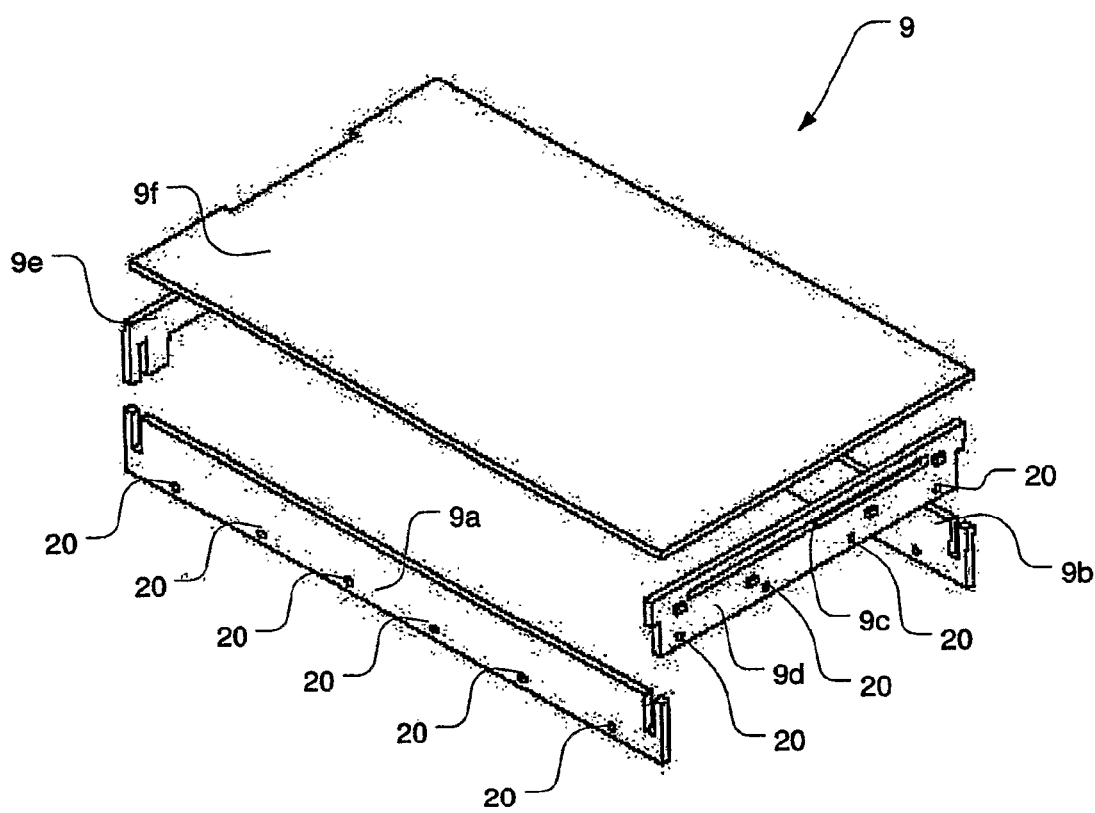
FIG. 5 is an exploded view of the cover shown in FIG. 2.

Referring to FIG. 5, the cover 9 comprises first and second side walls 9a, 9b, first and second end walls 9c, 9d and a roof 9f. Each of the side walls 9a, 9b, the end walls 9d, 9e and the roof 9f is made from multi-layer PCB and contains mutually off-set and cross-crossing serpentine conductive tracks like those of the PCB 8 and shown exaggeratedly in FIGS. 4(a) to 4(d). The serpentine tracks are configured to make it impossible to drill through the cover without breaking one of the paths. The loops of the serpentine tracks are packed as close as is practicable. A complete conductive sheet (not shown), forming a ground plane, is included on the outside of the serpentine paths to prevent visual inspection of the tracking layers beneath, to act as a grounding contact if a metal drill is used to attack the serpentine tracks and also acts to reduce electromagnetic emissions from the assembly. Additionally, there is the possibility that a tool being using in an attempt to probe through the cover 9 will short a serpentine track 18a, 18b, 18c, 18d to the ground plane.

The ends of the side walls 9a, 9b and the first end wall 9e have notches. The notches enable the first end wall 9e to be connected to the side walls 9a, 9b by halving joints. The second end wall 9d has short tabs at either end which are received in the remaining notches in the first and second side walls 9a, 9b.

The roof 9f is rectangular and has a shallow notch in one end. This notch receives a short tongue, that projects from the top of the first end wall 9d, to locate the roof 9f.

The elements 9a, 9b, 9d, 9e, 9f of the cover 9 are held together by solder joints which also serve to interconnect the serpentine conductive paths in the different elements 9a, 9b, 9d, 9e, 9f.

The serpentine tracks in the cover are connected to the PCB 8 via a connector, comprising a part 10 located centrally on the PCB 8 which mates with another part (not shown) located centrally on the underside of the roof 9f. Electrical connection is only made by the connector when the male part is fully inserted into the female part. This prevents removal of the cover 9 from PCB 8 without breaking the tamper detection circuit. The connector is completely enclosed by the cover 9

A slot 9c just large enough to allow a credit card to pass lengthwise is provided in the second end wall 9d. The second end wall 9d includes embedded conductors up to the edge of the slot 9c such that the slot 9c cannot be enlarged without breaking a conductor.

The side walls 9a, 9b and the second end wall 9d each have a line of small through holes 20 in their lower margins, i.e. the parts received in the channels 15 formed on the back of the front main member 2a.

Figure 6:
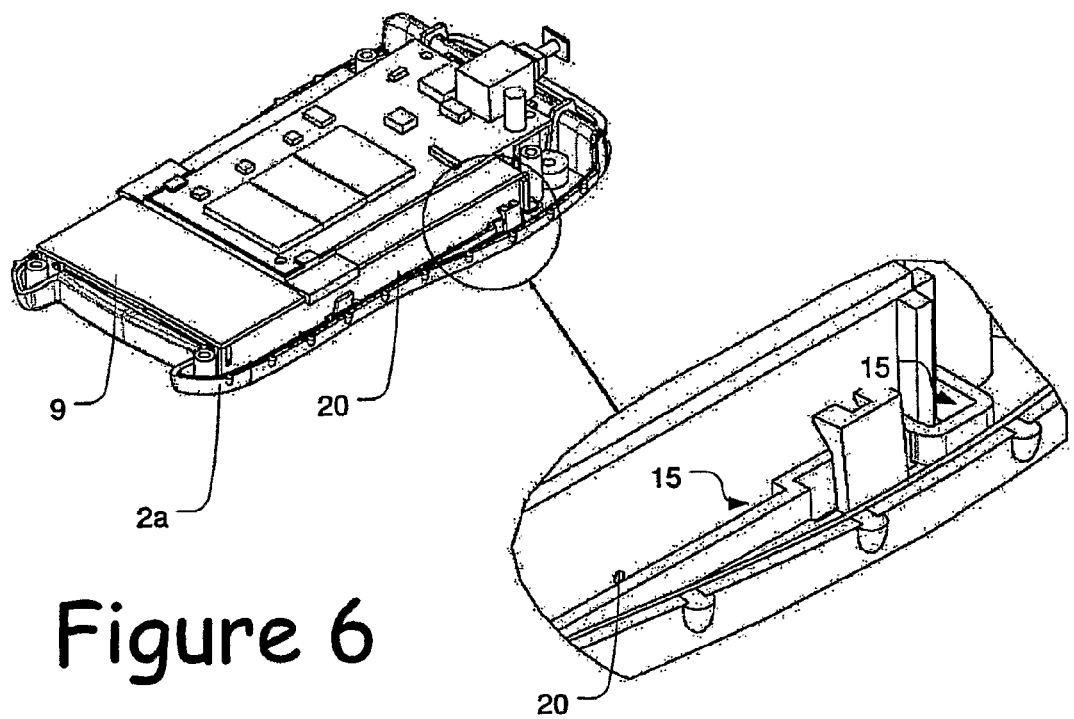
FIG. 6 shows a detail of the cover mounted to the front main member of the module shown in FIG. 1 without potting material.

Referring to FIG. 6, when the cover 9 has been located over the PCB 8, its side walls 9a, 9b and the second end wall 9d are received in the channels 15 such that the through holes 20 are within the channels 15.

Figure 7:
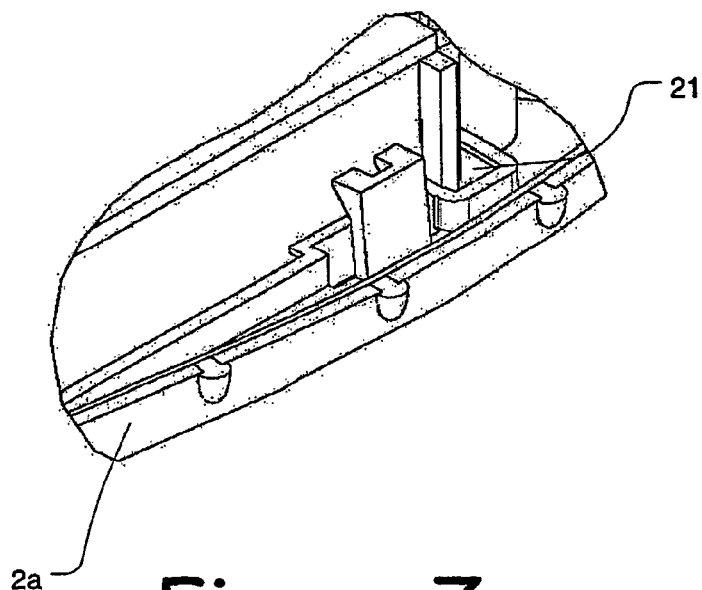
FIG. 7 shows potting material holding the cover in place.

Referring to FIG. 7, the cover 9 is secured in position by an epoxy potting material 21. The potting material 21 extends into the through holes 20 locking the cover 9 in position.

Figure 8:
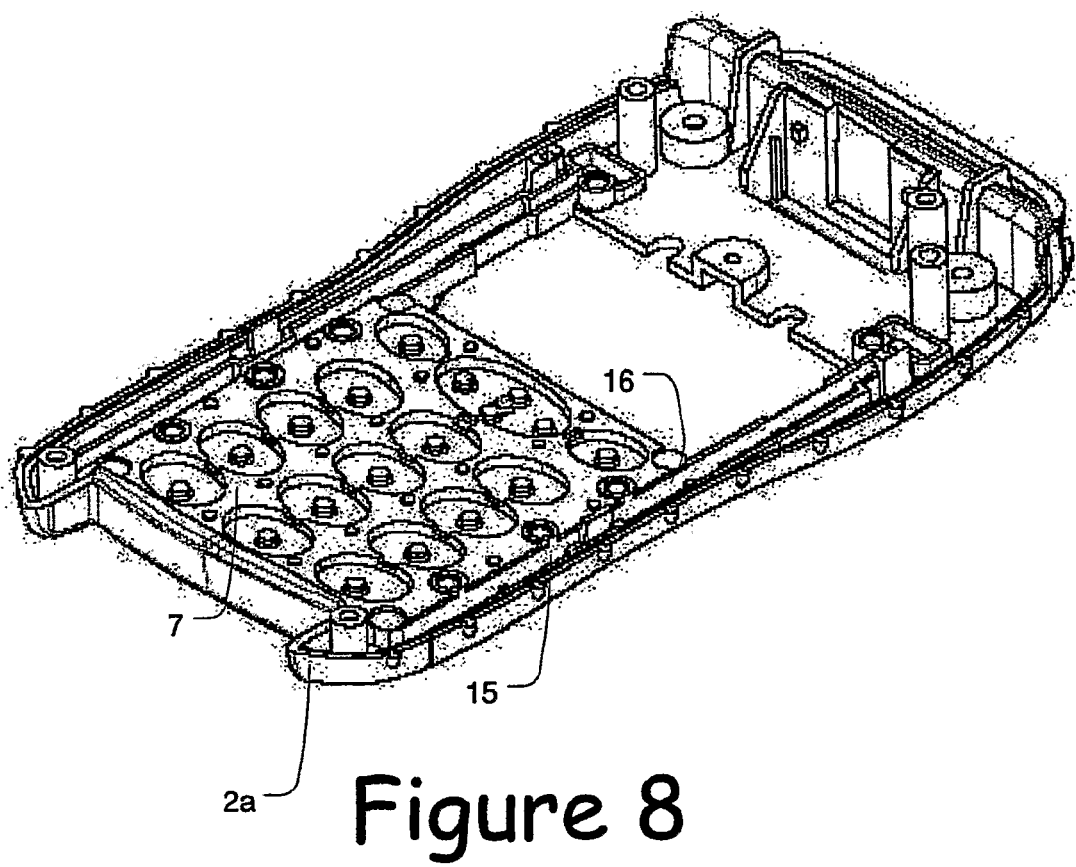
FIG. 8 shows the keypad membrane installed on the front main member of the module shown in FIG. 1.

Referring to FIG. 8, the inner walls 16 of the channels 15 project upward beyond the installed keypad membrane 7 to form a barrier preventing probes being inserted sideways under the keypad membrane 7.

Figure 9:
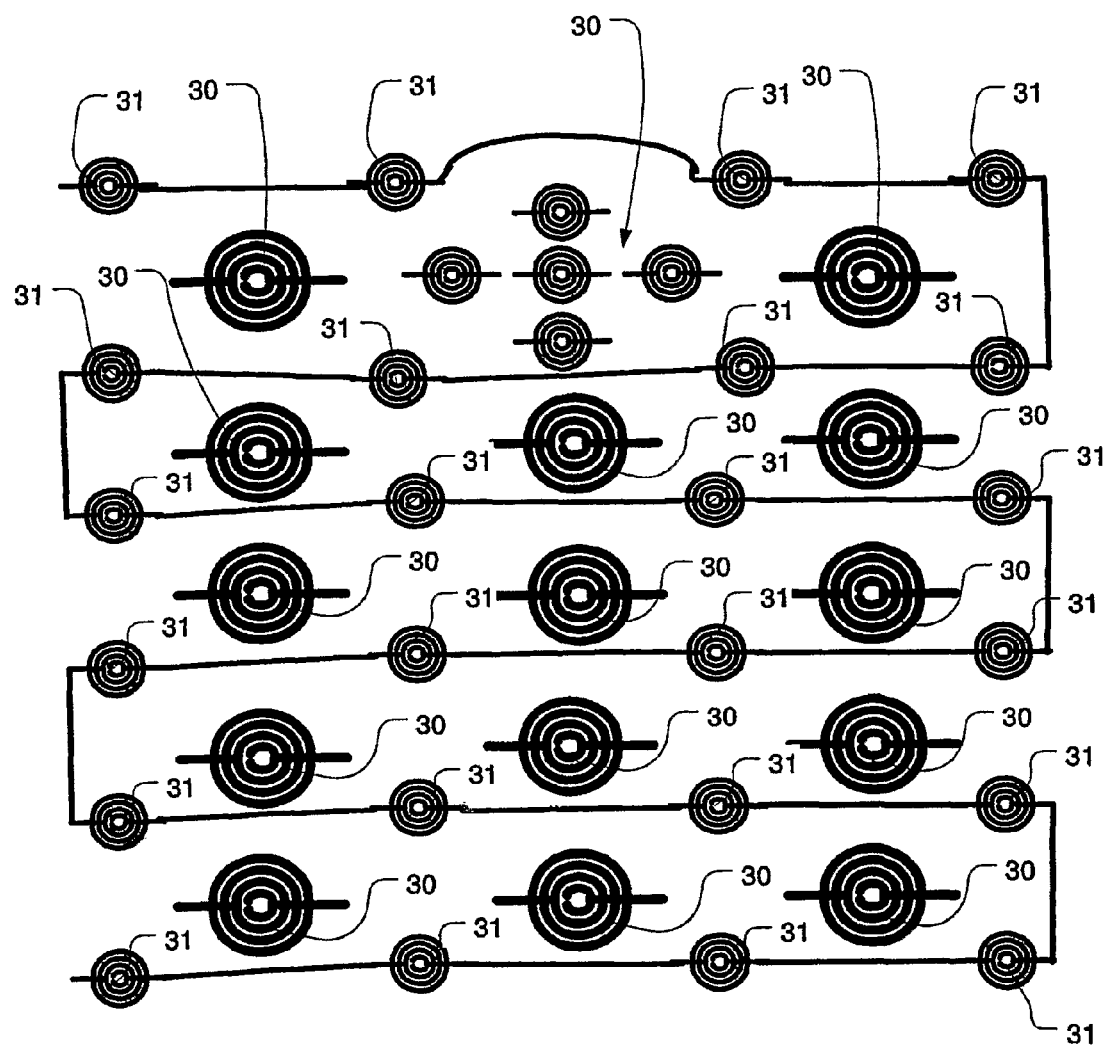
FIG. 9 shows part of the front face of the first PCB in FIG. 2.

Referring to FIG. 9, the front face of the first PCB is provided with a conductor pattern comprising first and second sets of pairs of interdigitated contacts 30, 31.

Figure 10:
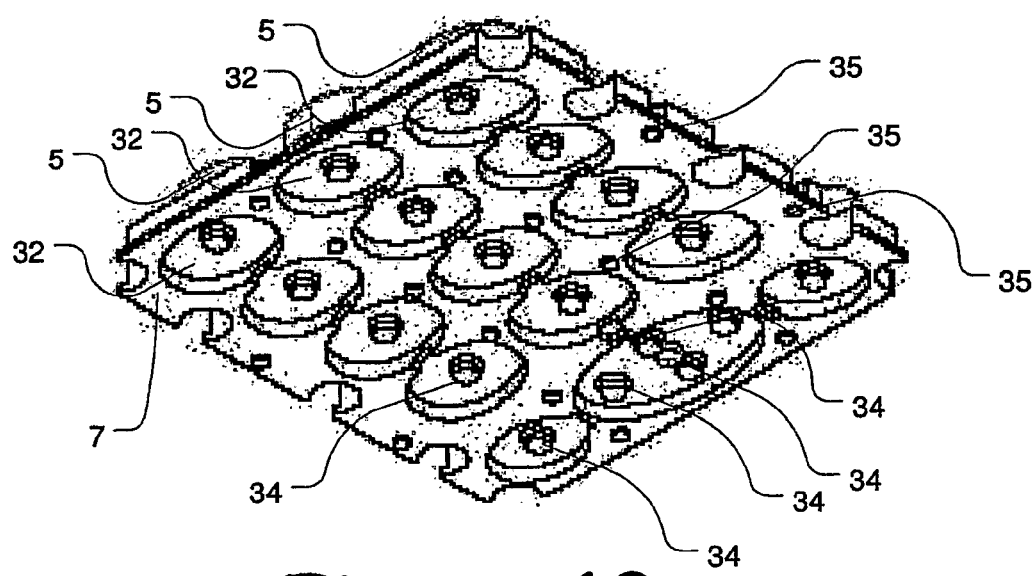
FIG. 10 shows the keypad membrane.

Referring to FIG. 10, the key pad membrane 7 is moulded from an elastomeric material. A recess 32 is formed under each key 5 and carbon pills 34 are mounted in the recesses 32. Additional carbon pills 35 are distributed in non-recessed parts of the keypad membrane 7.

When the PCB 8 is installed behind the keypad membrane 7, the carbon pills 34 in the recesses 32 are aligned with the contact pairs 30 of the first set and are shorted only when keys 5 are pressed to produce user input signals. The other carbon pills 35 are aligned with the contact pairs 31 of the second set. The contact pairs of the second set are shorted by default. Thus, the circuitry on the PCB 8 can detect attempts to probe behind the membrane by detecting an interruption in a current flowing through the contact pairs 31 of the second set.

Figure 11:
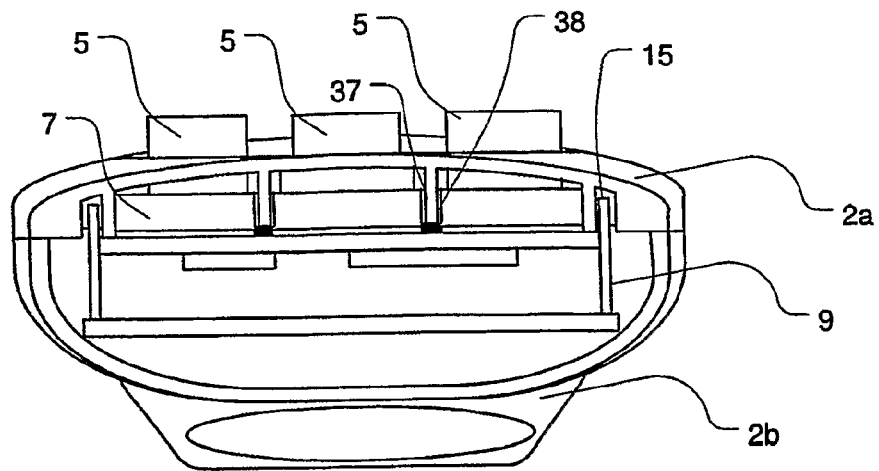
FIG. 11 is a cross-section of the module of FIG. 1 along the line AA.

Referring to FIG. 11, the front main member 2a has a plurality of pillars 37 that project backwards between the holes. These pillars 37 are received by blind holes 38 in the keypad membrane 7 to press it towards the PCB 8. The blind holes 38 are aligned with the carbon pills 35, associated with the contact pairs 31 of the second set, and ensure that these contacts remain shorted during normal use.

Figure 12:
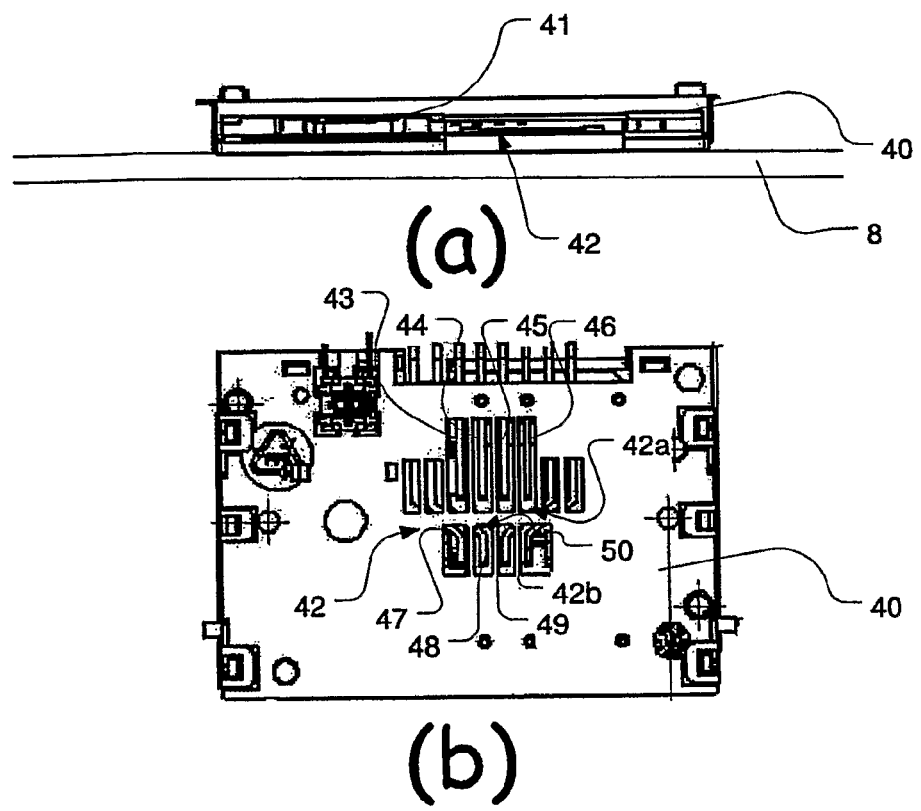
FIGS. 12(a) and 12(b) are respectively front and top views of the chip card contact module used in the card reader module shown in FIG. 1.

Referring to FIGS. 12(*a*) and 12(*b*), a chip card contact module 40 is mounted on the PCB 8. The module 40 has a slot 41 that can receive a card inserted through the second slot 6 and slot 9c. A set of contacts 42 is arranged to make contact with the contacts of a properly inserted card. The contacts 42 are arranged in two tows 42a, 42b of four. The rear row 42a, i.e. the row furthest from the second slot 6, comprises the ends of four conductors 43, 44, 45, 46 that extend straight back away from the second slot 6. The front row 42b comprises the ends of four conductors 47, 48, 48, 50 which also extend back away from the second slot 6. However, these conductors 47, 48, 48, 50 jink sideways so that two extend straight back on each side of the conductors 43, 44, 45, 46 from the first row 42a of contacts.

Figure 13:
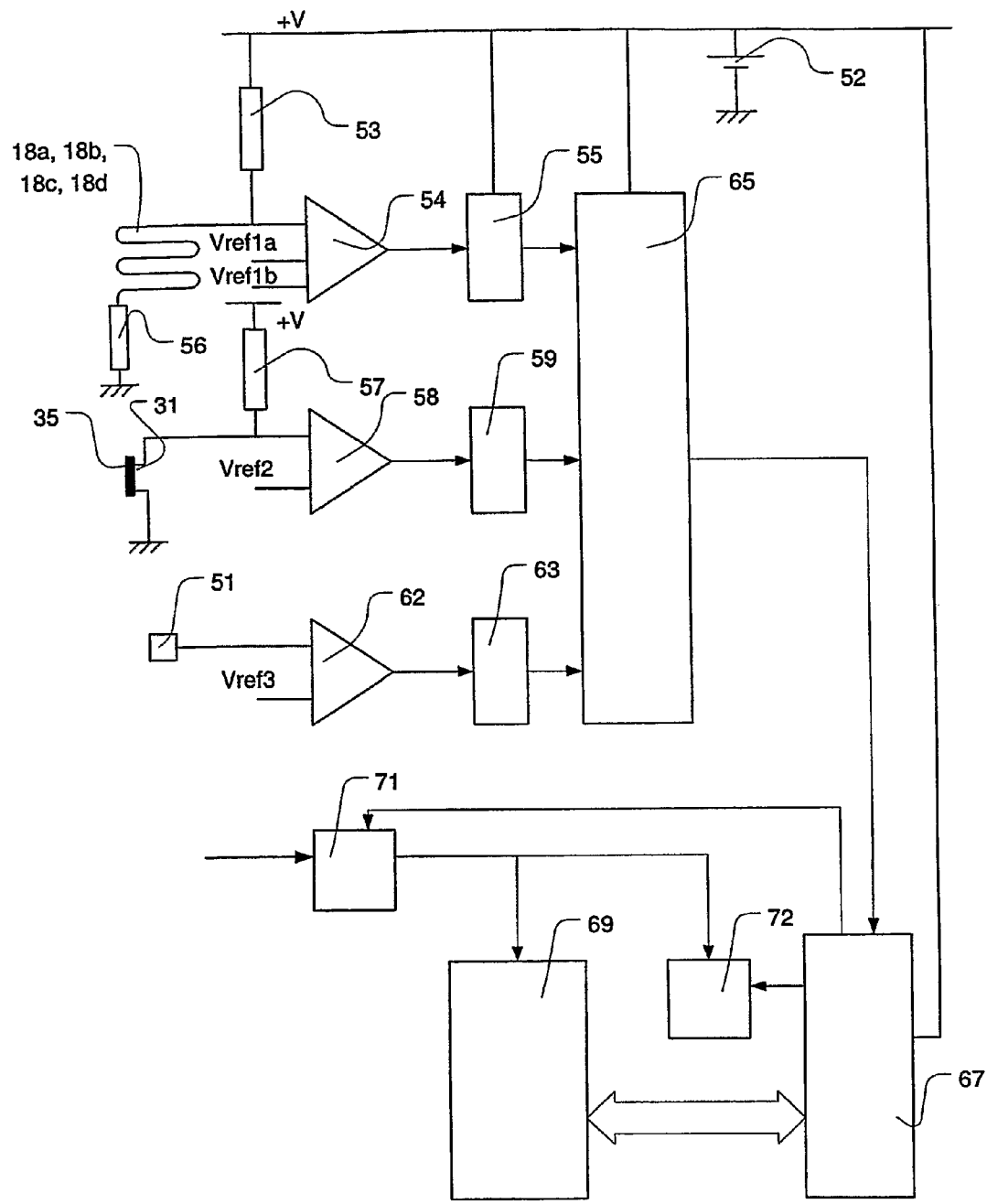
FIG. 13 is a block diagram of the tamper detection circuitry of the card reader of FIG. 1.

Referring to FIG. 13, the card reader has three distinct tamper detection system. These comprise the serpentine tracks 18a, 18b, 18c, 18d and associated circuitry, the additional carbon pills 35 and associated circuitry, and a temperature sensor 51 located within the cover 9, and associated circuitry.

A small battery 52, located within the cover 9, provides a permanent supply of power for the tamper detection circuitry.

The serpentine tracks 18a, 18b, 18c, 18d are connected in series between first and second resistors 53, 56. The first resistor 53 is connected to the positive terminal of the battery 52. The second resistor 56 is connected to ground. The node formed by the first resistor 53 and the serpentine tracks 18a, 18b, 18c, 18d is also connected to a first input of a window comparator 54. A second input of the window comparator 54 is provided with a first reference voltage Vref1*a*, which is derived from the voltage across the battery 52, and a third input of the window comparator 54 is provided with a second reference voltage Vref1*b*, which is derived from the voltage across the battery 52.

Under normal conditions, the first input of the window comparator 54 is between the first and second reference voltages Vref1*a*, Vref1*b* and the output of the first comparator 54 is low. However, if one of the serpentine tracks 18a, 18b, 18c, 18d is broken, the voltage on the first input of the window comparator 54 rises past the first reference voltage Vref1*a*, causing the output of the window comparator 54 to go high. Similarly, if one of the serpentine tracks 18a, 18b, 18c, 18d is grounded, the voltage on the first input of the window comparator 54 falls past the second reference voltage Vref1*b*, causing the output of the window comparator 54 to go high.

A first latch 55 latches the high state of the output of the window comparator 54 so that even fleeting disturbances of the current through the serpentine tracks 18a, 18b, 18c, 18d can be responded to reliably.

The carbon pills 35 and associated contact pairs 31 are connected in series between a pull-up resistor 57. The node formed by the pull-up resistor 57 and current path through the carbon pills 35 and associated contact pairs is also connected to a first input of a first comparator 58 A second input of the first comparator 58 is provided with a third reference voltage Vref2, which is derived from the voltage across the battery 52.

Under normal conditions, the first input of the first comparator 58 is low and the output of the first comparator 58 is also low. However, if the keypad membrane 7 is lifted, separating a carbon pill 35 from the associated contacts 31, the voltage at the first input of the first comparator 58 rises past the third reference voltage Vref2 and the output of the second comparator 58 then goes high. A second latch 59 latches the high state of the output of the first comparator 58 so that even a fleeting lifting of part of the keypad membrane 7 can be reliable responded to.

The output of the temperature sensor 51 is connected to a first input of a second comparator 62. The other input of the second comparator 62 is provided with a fourth reference voltage Vref3, which is derived from the voltage across the battery 52.

Under normal conditions, the output of the second comparator 62 is low. However, if the temperature, sensed by the temperature sensor 51 falls below −25°, which indicates cooling being used to slow the response of other tamper detection systems, the output of the second comparator 68 goes high and is latched by a third latch 63.

The outputs of the latches 55, 59, 63 are supplied to concentrating circuit 65, e.g. an AND-gate, which produces an erase signal when the outputs of any one or more of the latches 55, 59, 63 is high.

The erase signal is fed to an erase circuit 67 which is responsible for zeroisation of the security module's memory 69. In response to the erase signal, the erase circuit 67 write zero to every location in the memory 69 and then opens a first switch 71 to remove power from the memory 69. Finally, a second switch 72 is closed to remove any residual charge from the memory 69.

It will be appreciated that the security features described above may be used in other combination both with each other and with other security features not described herein.

The invention claimed is:
1. A chip card contact module comprising:
a chamber for receiving a chip card, the chip card having a contact pad for providing access to data stored on the chip card;
a card input slot for accessing the chamber; and
a set of contacts within the chamber for contacting the contact pad of a chip card inserted in the chamber;
the chip card contact module further comprising a plurality of conductors, each conductor leading away from a respective contact within the chamber to enable connection of the contacts to circuitry for processing data accessed from a chip card, wherein none of said conductors leads from a contact towards the card input slot.

2. A chip card contact module according to claim 1, wherein the contacts are arranged in two rows comprising a front row and a back row, the front row being nearer the card input slot than the back row.

3. A chip card contact module according to claim 2, wherein the conductors from the back row lead directly away from the card input slot and the conductors from the front row diverge and then lead directly away from the card input slot.

4. A chip card contact module according to claim 1, wherein the conductors extend to the exterior of the card contact module, the exterior portions of the conductors being located at the opposite side of the card contact module to the card input slot.

5. An apparatus including a chip card contact module according to claim 1, the apparatus comprising an anti-tamper enclosure including an aperture aligned with the card input slot of the chip card contact module, the aperture being configured to allow insertion of an electronic card and the anti-tamper enclosure further including at least one embedded tamper detection conductor path for detection of widening of the aperture.

6. An apparatus according to claim 5, wherein the anti-tamper enclosure is provided as a rigid structure.

7. An apparatus according to claim 5, wherein the aperture is configured for endways insertion of an electronic card.

8. An apparatus according to claim 5, wherein the conductive path or paths extend across the whole of the enclosure such that cutting through the enclosure without breaking or grounding an embedded conductive path is substantially impracticable.

9. An apparatus according to claim 5, wherein the conductive path or paths are arranged in a plurality of layers such that conductors in different layers are offset relative to each other.

10. An apparatus according to claim 5, where the enclosure is assembled from a plurality of printed circuit boards.

11. An apparatus according to claim 10, wherein a plurality of said printed circuit boards are electrically connected.

12. An apparatus according to claim 10, wherein a plurality of said printed circuit boards are connected by an interlocking mechanical joint.

13. An apparatus according to claim 5, wherein the chip card contact module serves as an anti-probing barrier behind the aperture preventing access to an electronic circuit.

14. An apparatus according to claim 13, wherein the electronic circuit comprises means for feeding current through each conductive path and detecting disturbances thereof.

15. An apparatus according to claim 13, wherein the electronic circuit comprises a multi-layer printed circuit board having a first face on which components are mounted and a second face on which no components are mounted.

16. An apparatus according to claim 15, wherein the conductors carrying signals between said components are separated from the second face by a tamper detection conductive path.

17. An apparatus according to claim 5, wherein the apparatus comprises a card reader.

18. An apparatus according to claim 5, wherein the aperture comprises a slot.

19. A chip card reader comprising a chip card contact module according to claim 1.

* * * * *